United States Patent
Tsai et al.

(10) Patent No.: US 7,439,802 B2
(45) Date of Patent: Oct. 21, 2008

(54) UNILATERAL FEEDBACK POWER AMPLIFIER AND METHOD FOR REALIZING THE SAME

(75) Inventors: Zuo-Min Tsai, Taipei (TW); George D. Vendelin, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 112 days.

(21) Appl. No.: 11/621,793

(22) Filed: Jan. 10, 2007

(65) Prior Publication Data

US 2008/0068077 A1    Mar. 20, 2008

(30) Foreign Application Priority Data

Sep. 19, 2006   (TW) ............................. 95134587 A

(51) Int. Cl.
*H03F 1/36* (2006.01)
(52) U.S. Cl. ........................................ 330/109; 330/302
(58) Field of Classification Search ................. 330/109, 330/302, 277, 75
See application file for complete search history.

(56) References Cited

U.S. PATENT DOCUMENTS

| | | | |
|---|---|---|---|
| 4,614,915 A | | 9/1986 | Heston et al. |
| 4,771,247 A | | 9/1988 | Jacomb-Hood |
| 6,211,738 B1 | * | 4/2001 | Hecht .......................... 330/292 |
| 7,298,205 B2 | * | 11/2007 | Nakatani et al. ............ 330/107 |
| 7,355,479 B2 | * | 4/2008 | Van Der Heijden ......... 330/292 |

OTHER PUBLICATIONS

Gupta, M.; "Power Gain in Feedback Amplifiers, a Classic Revisited"; IEEE Transactions on Microwave Theory and Techniques; vol. 40, No. 5, May 1992; pp. 864-879.
van der Heijden, M., et al.; "On the Design of Unilateral Dual-Loop Feedback Low-Noise Amplifiers with Simultaneous Noise, Impedance, and IIP3 Match"; IEEE Journal of Solid-State Circuits; vol. 39, No. 10, Oct. 2004; pp. 1727-1736.
"Manual of HWF 1686RA"; Hexawave, Inc.; Autumn 2002; 3 pages.
Tsai, Z., et al.; "A New Feedback Method for Power Amplifier with Unilateralization and Improved Output Return Loss"; IEEE Transactions on Microwave Theory and Techniques; vol. 54, No. 4, Apr. 2006; pp. 1590-1597.

* cited by examiner

*Primary Examiner*—Henry K Choe
(74) *Attorney, Agent, or Firm*—Rosenberg, Klein & Lee

(57) ABSTRACT

A unilateral feedback power amplifier utilizes new feedback techniques and devices to make the amplified high-frequency signal unilateral, let the output power, power gain and impedance matching simultaneously accomplish the optimal values, and enhance the stability of the system. In this feedback amplifier, a generalized multi-port feedback circuit is in shunt with the input terminal and the output terminal of the power transistor. This generalized multi-port feedback circuit receives an amplified high-frequency signal and eliminates the reverse admittance of the amplified high-frequency signal to let the admittance value of the output amplified high-frequency signal approach zero so as to be unilateral. Moreover, the generalized multi-port feedback power amplifier differs from the conventional power amplifier of cascaded architecture in that the ground terminal of the power transistor is directly connected to the system ground. Therefore, the heat-radiating problem of the power transistor can be greatly improved.

10 Claims, 3 Drawing Sheets

US 7,439,802 B2

UNILATERAL FEEDBACK POWER AMPLIFIER AND METHOD FOR REALIZING THE SAME

BACKGROUND OF THE INVENTION

1. Field of the Invention

The present invention relates to a power amplifier and a method for realizing the same and, more particularly, to a method of using a generalized multi-port feedback circuit device to make a power amplifier unilateral.

2. Description of Related Art

Feedback techniques were used to implement the unilateral amplifiers. There are basically three types of feedback amplifiers. The first is the high gain amplifier (HGA), which was presented by Mason in 1954. Feedback and matching circuits are used to make the input and output reflection loss ($S_{11}$ and $S_{22}$) and the reverse gain ($S_{12}$) zero, and unilateral gain is simultaneously accomplished. Therefore, the amplifier becomes an ideal and unilateral amplifier.

The second is the low noise amplifier (LNA), which was presented by Vendelin in 1975, gives the lowest noise figure (NF) and $S_{11}'=0$. In the design idea of conventional low noise amplifiers, because the optimum matching points of noise and gain are not identical, a compromise should always be made between noise and gain when designing a low noise amplifier. Therefore, the feedback circuit idea of linear amplifiers is also applied in the design of low noise amplifiers afterwards. Through the help of a feedback circuit, the optimum matching points of noise and gain can be made identical so as to simultaneously accomplish matching of noise and gain. In 2004, a paper of M. P. Van der Heijden also achieved unilateral function of low noise amplifier.

In 1986, Texas Instruments Incorporated disclosed a patent of common source feedback circuit and applied it to low noise amplifiers. This is the first example of using a single chip to manufacture a feedback low noise amplifier. A similar patent was disclosed by General Electric Corporation in 1997, in which a similar single chip low noise amplifier was proposed. Why the linear feedback circuit can be used in low noise amplifiers is that the power of noise itself is very small so that the noise source can be approximated as a linear voltage or current source. Therefore, the linear circuit theory can be applied in low noise amplifiers.

The third is the high power amplifier (HPA). In the design of a microwave emitter, the power amplifier determines the output power of the emitter. However, a compromise should always be made between output power, power gain and impedance matching when using a power amplifier of the conventional architecture. Until recently, feedback and unilateralization of power amplifier has never been fully treated. Because power amplifiers will encounter the problem of nonlinearity, the linear circuit theory cannot be used in the design of power amplifier.

FIG. 1 is a diagram of a conventional power amplifier. As shown in FIG. 1, through the measurement of load pull of the power transistor, the load admittance ($Y_{opt}$) capable of achieving the maximum output power can be calculated. The load admittance capable of achieving the maximum output power, however, can not accomplish optimization of gain and impedance matching.

As can be known from the above examples, feedback techniques are indispensable to the design and improvement of amplifiers. Accordingly, the present invention aims to provide a feedback method and device capable of realizing unilateralization of power amplifier.

SUMMARY OF THE INVENTION

An object of the present invention is to provide a unilateral feedback power amplifier and a method for realizing the same, in which a generalized multi-port feedback circuit is used to let the output power, power gain and impedance matching of a power amplifier accomplish the optimum values. Moreover, the high-frequency signal amplified by the power amplifier is made unilateral to enhance the stability of the system.

Another object of the present invention is to provide a unilateral feedback power amplifier, in which the ground terminal of a power transistor is directly connected to the system ground to let the power transistor have a better heat-radiating effect.

To achieve the above objects, the present invention connects a generalized multi-port feedback circuit between an input terminal and an output terminal of a power transistor to eliminate the reverse admittance of the high-frequency signal amplifier by the power transistor so as to let the admittance value of the output amplified high-frequency signal approach zero and make the power transistor unilateral. In order to provide a better heat-radiating effect, the ground terminal of the power transistor is directly connected to the system ground. Moreover, the unilateral feedback power amplifier further comprises two impedance matching circuits, which are disposed at the signal input terminal and the signal output terminal, respectively, and are used to perform impedance matching to the high frequency signal from the signal input terminal to the signal output terminal.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

The present invention proposes a new unilateral feedback power amplifier, in which a generalized multi-port feedback circuit is used to let the output power, power gain and impedance matching of a power amplifier accomplish the optimum values. Moreover, the high-frequency signal amplified by the power amplifier is made unilateral to enhance the stability of the system. The present invention will be exemplified with generalized 4-port feedback circuits below.

Figure 1:
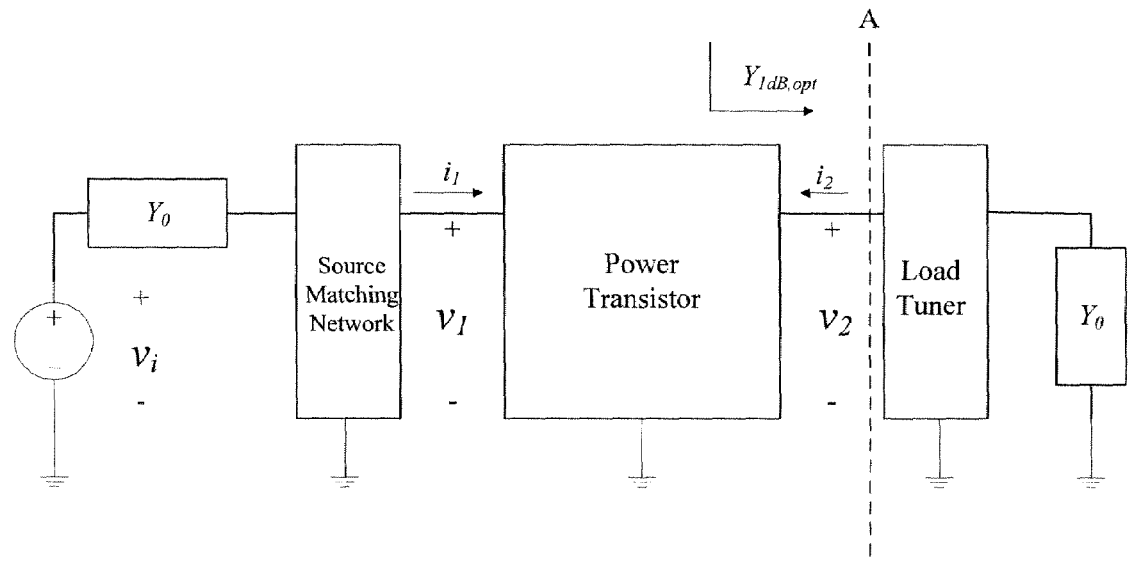
FIG. 1 is a diagram of a conventional power amplifier.
Figure 2:
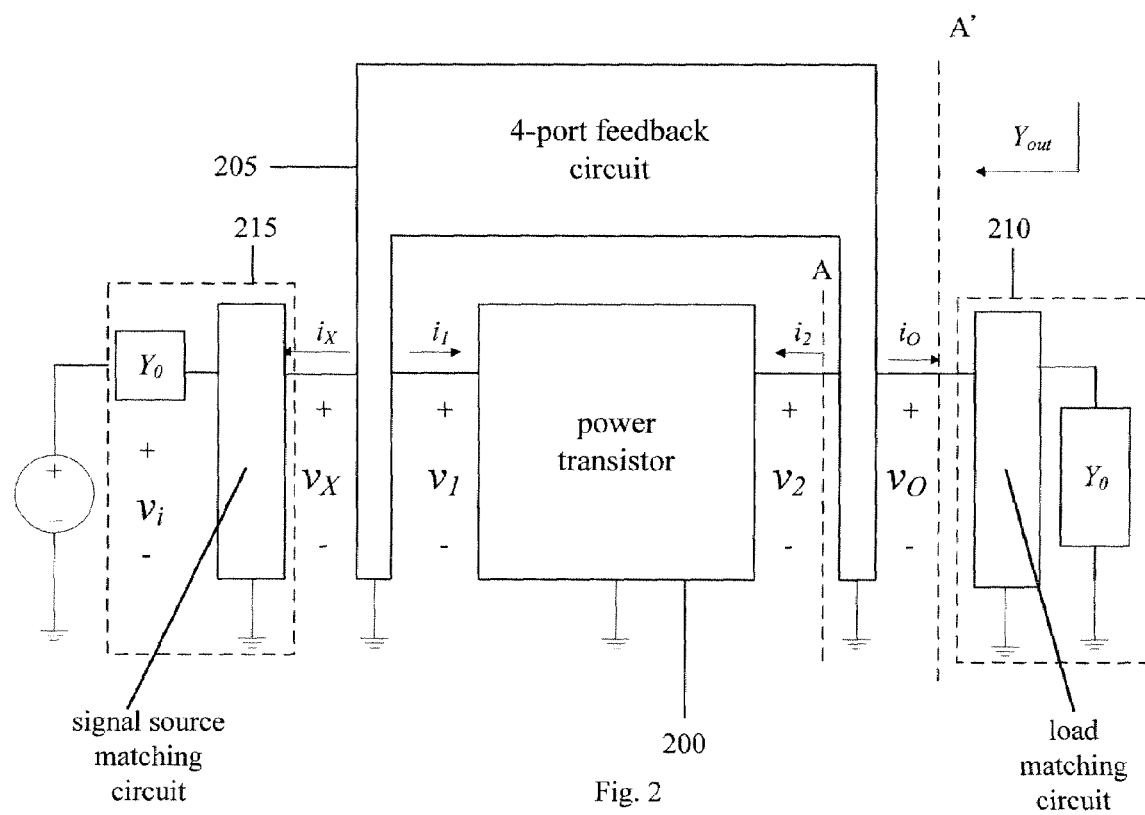
FIG. 2 is a block diagram of the present invention.

In order to improve the drawbacks of conventional power amplifiers, as shown in FIG. 2, the present invention proposes a new unilateral feedback power amplifier, which comprises a 2-port power transistor 200, a generalized 4-port feedback circuit 205, an output impedance matching circuit 210 and an input impedance matching circuit 215. It should be noted that the generalized 4-port feedback circuit 205 includes all feedback circuits that can be used with 2-port power transistors (a 2- or 3-port feedback circuit can be viewed as a special case of the generalized 4-port feedback circuit). The generalized 4-port feedback circuit 205 in FIG. 2 is further composed of two 2-port circuits and a capacitive shunt component. Through the feedback circuit, in order to let the admittance $Y_{opt}$ of the output terminal of the power transistor 200 viewed at plane A satisfy $Y_{1dB,opt}$, the required load admittance at plane A' is converted to:

$$Y_L = \frac{\begin{pmatrix} -Y_{24}^f Y_{33}^f Y_{41}^f Y_{21}^d + Y_{23}^f Y_{34}^f Y_{41}^f Y_{21}^d + \\ Y_{24}^f Y_{31}^f Y_{43}^f Y_{21}^d - Y_{21}^f Y_{34}^f Y_{43}^f Y_{21}^d - Y_{23}^f Y_{31}^f Y_{44}^f Y_{21}^d + \\ Y_{21}^f Y_{33}^f Y_{44}^f Y_{21}^d + Y_{34}^f Y_{41}^f Y_{12}^d Y_{21}^d - Y_{31}^f Y_{44}^f Y_{12}^d Y_{21}^d + \\ Y_{24}^f Y_{32}^f Y_{41}^f Y_{22}^d - Y_{22}^f Y_{34}^f Y_{41}^f Y_{22}^d - Y_{24}^f Y_{33}^f Y_{42}^f Y_{22}^d + \\ Y_{21}^f Y_{34}^f Y_{42}^f Y_{22}^d + Y_{22}^f Y_{31}^f Y_{44}^f Y_{22}^d - Y_{21}^f Y_{32}^f Y_{44}^f Y_{22}^d - \\ Y_{34}^f Y_{41}^f Y_{11}^d Y_{22}^d - Y_{34}^f Y_{41}^f Y_{11}^d Y_{22}^d + Y_{31}^f Y_{44}^f Y_{11}^d Y_{22}^d + \\ Y_{24}^f Y_{32}^f Y_{41}^f Y_{opt} - Y_{24}^f Y_{32}^f Y_{42}^f Y_{opt} + Y_{21}^f Y_{34}^f Y_{42}^f Y_{opt} + \\ Y_{22}^f Y_{31}^f Y_{44}^f Y_{opt} - Y_{34}^f Y_{41}^f Y_{11}^d Y_{opt} + Y_{31}^f Y_{44}^f Y_{11}^d Y_{opt} + \\ Y_{24}^f Y_{32}^f Y_{21}^d Y_{opt} - Y_{21}^f Y_{44}^f Y_{21}^d Y_{opt} \end{pmatrix}}{\begin{pmatrix} Y_{23}^f Y_{31}^f Y_{21}^d - Y_{21}^f Y_{33}^f Y_{21}^d + Y_{31}^f Y_{12}^d Y_{21}^d - Y_{22}^f Y_{31}^f Y_{22}^d + \\ Y_{21}^f Y_{32}^f Y_{22}^d - Y_{31}^f Y_{11}^d Y_{22}^d - Y_{22}^f Y_{31}^f Y_{opt} + Y_{21}^f Y_{32}^f Y_{opt} - \\ Y_{31}^f Y_{11}^d Y_{opt} + Y_{21}^f Y_{21}^d Y_{opt} \end{pmatrix}}$$

where $Y_{mn}^f$, (m,n∈N, 1≦m,n≦4) are 4-port admittance matrix parameters of the generalized 4-port feedback circuit, $Y_{21}^d$ (m,n∈N, 1≦m,n≦2) are 2-port admittance matrix parameters of the power transistor. By adjusting the 4-port admittance matrix parameters of the generalized 4-port feedback circuit 205, the power transistor 200 plus the generalized 4-port feedback circuit can first be made unilateral, and conjugate matching of $Y_L$ and the output impedance $Y_{OUT}$ of the power transistor 200 matched with the 4-port feedback circuit 205 can then be achieved. In this way, the output power, power gain and impedance matching of the power transistor 200 can simultaneously accomplish the optimum values.

Figure 3:
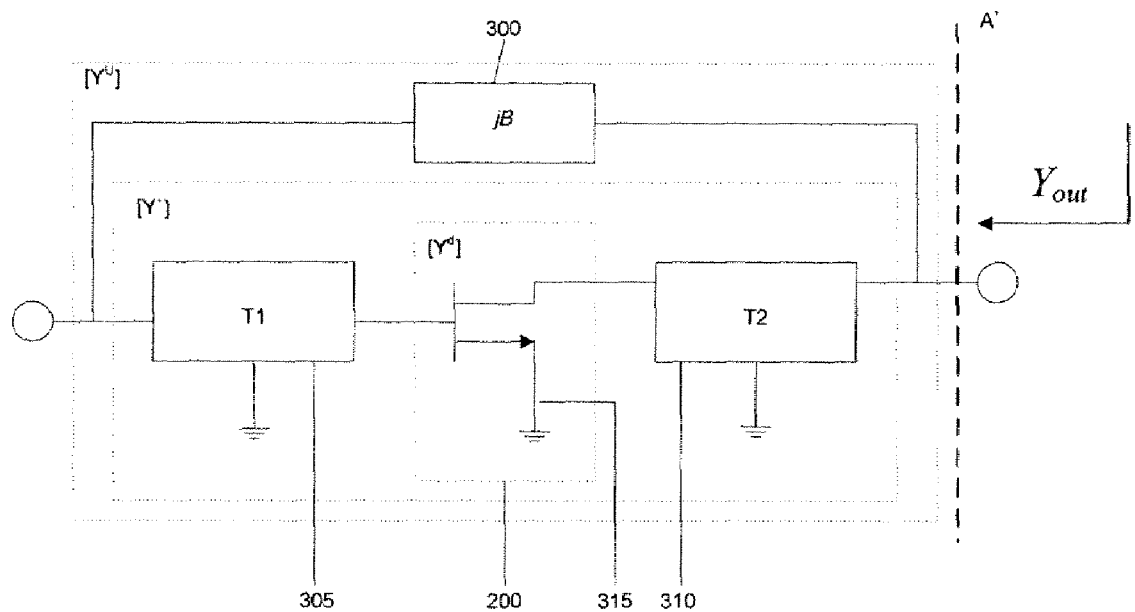
FIG. 3 is a diagram of the generalized 4-port feedback circuit of the present invention.

FIG. 3 is a diagram of the generalized 4-port feedback circuit 205 of the present invention. The generalized 4-port feedback circuit 205 comprises a capacitive shunt component (jB) 300 and a generalized 2-port circuit (T1) 305 disposed at the input terminal of the power transistor 200 and a generalized 2-port circuit (T2) disposed at the output terminal of the power transistor 200. Moreover, a ground terminal 315 of the power transistor 200 is directly connected to the system ground to greatly improve the heat-radiating problem. The steps of making the power transistor 200 unilateral are as follows: first adjusting T1 (305) and T2 (310) to let the real part of the reverse admittance $Y_{12}'$ in [Y'] be zero; then using the capacitive shunt component (jB) 300 to eliminate the imaginary part of the reverse admittance $Y_{12}'$ in [Y']. Because there are many sets of (T1) 305 and (T2) 310 letting the real part of $Y_{12}'$ be zero, an arbitrary set can be chosen to accomplish conjugate matching of $Y_L$ and the output impedance $Y_{out}$ of the power transistor 200 matched with the 4-port feedback circuit 205.

Figure 4:
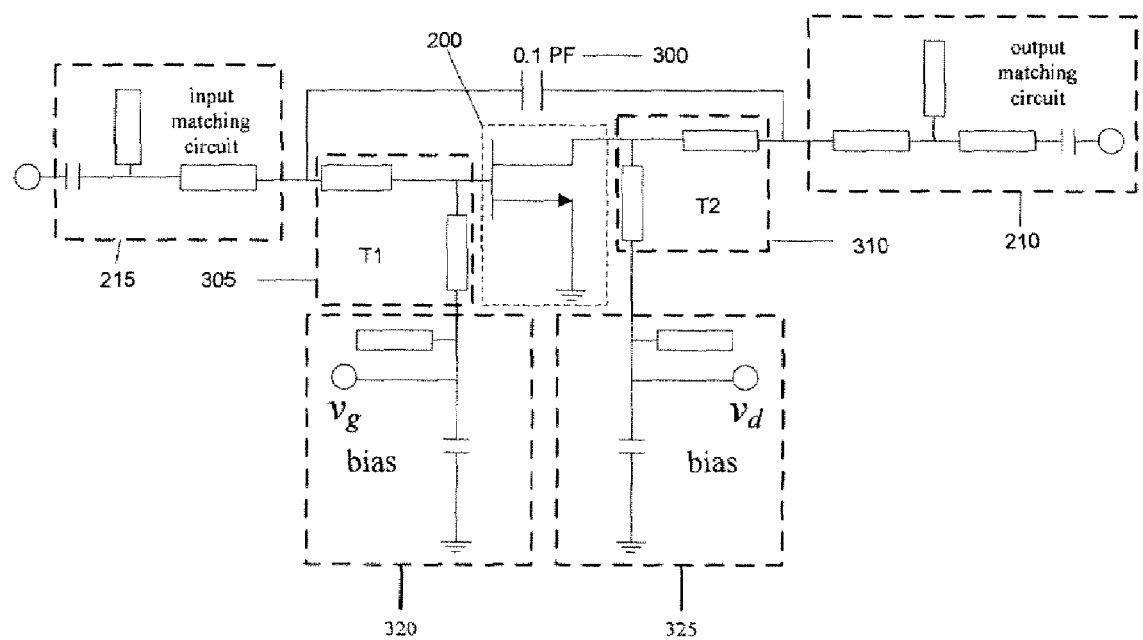
FIG. 4 is a circuit diagram of the generalized 4-port feedback power amplifier of the present invention.
Figure 5:
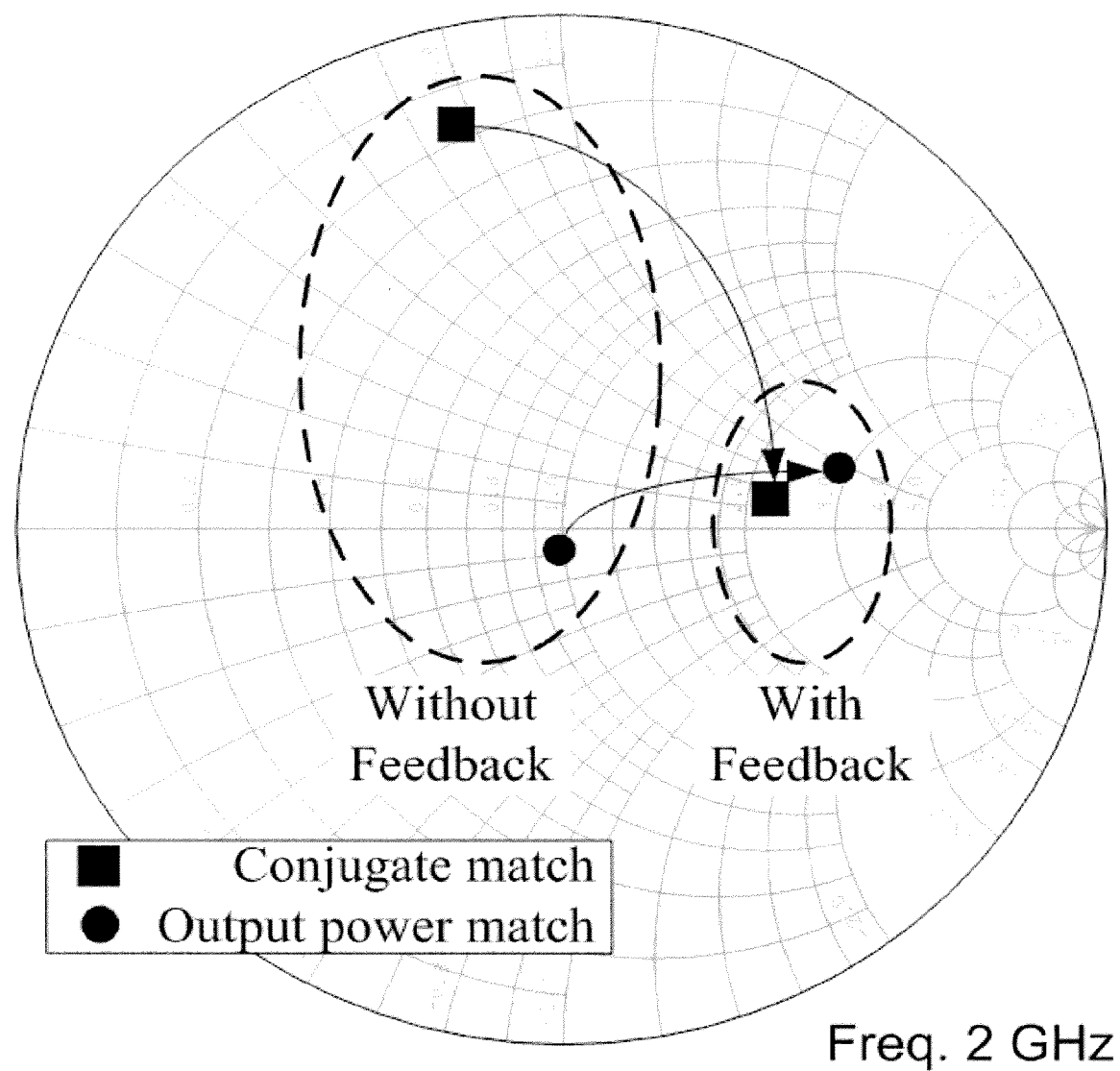
FIG. 5 is a diagram showing the positions of the power matching points and the conjugate matching points on the Smith chart with and without the feedback amplifier.

FIG. 4 is a circuit diagram of the generalized 4-port feedback power amplifier of the present invention. The power transistor 200 used is of the type HWF1686RA manufactured by Hexawave Inc. Each of the generalized 2-port circuits (T1) 305 and (T2) 310 is realized with a series transmission line and a parallel transmission line. The capacitive shunt component (jB) 300 is realized with a capacitor of 0.1 pF. The output matching circuit 210 and the input matching circuit 215 are realized using the transmission lines as the matching components. Moreover, a bias circuit 320 is responsible for providing a load voltage for the 2-port circuit (T1) 305, and a bias circuit 325 is responsible for providing a load voltage for the 2-port circuit (T2) 310. FIG. 5 is a diagram showing the positions of the power matching points and the conjugate matching points on the Smith chart with and without the feedback amplifier. As can be clearly seen from the figure, two matching points of the conventional power amplifier are far apart from each other, causing the designer to be hard to design an appropriate matching circuit. For a power amplifier added with the generalized 4-port feedback circuit of the present invention, however, the distance between the two matching points are apparently small, hence facilitating the design. It is also demonstrated that the 4-port feedback circuit of the present invention can let the output power, power gain and impedance matching of the power transistor simultaneously accomplish the optimum values. Table 1 shows the differences and improvements in characteristics of the conventional power amplifier without feedback and the power amplifier added with the generalized 4-port feedback circuit of the present invention. As can be clearly seen from Table 1, regardless of simulation or actual measurement, the power amplifier with feedback has apparent improvements in the characteristics such as reflection loss, power gain and reverse gain. Moreover, the output power ($P_{1dB}$) can achieve the output power of the conventional power amplifier.

TABLE 1

| Characteristics | Conventional power amplifier without feedback | | Power amplifier added with the generalized 4-port feedback circuit of the present invention | | Difference | |
|---|---|---|---|---|---|---|
| | Simulated | Measured | Simulated | Measured | Simulated | Measured |
| Power gain (dB) | 13.4 | 12.6 | 19 | 18.8 | 5.6 | 6.2 |
| Reverse gain (dB) | −28.3 | −30 | −41.6 | −43.1 | −13.3 | −13.1 |
| Output reflection loss (dB) | 3 | 3.8 | 11 | 8.6 | 8 | 4.8 |
| Input reflection loss (dB) | 30 | 12.2 | 23.6 | 20.4 | −6.4 | 8.2 |
| Gain compression ($P_{1dB}$) (dBm) at output power of 1 dB | | 29 | | 29 | | 0 |
| Power added efficiency (PAE) (%) | | 40 | | 37 | | −3 |

Although the present invention has been described with reference to the preferred embodiment thereof exemplified with a generalized 4-port feedback circuit, it will be understood that the invention is not limited to the details thereof.

Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A unilateral feedback power amplifier comprising:
a signal input terminal for receiving a high-frequency signal to be amplified;
a power transistor for receiving said high-frequency signal from said signal input terminal and outputting an amplified high-frequency signal;
a multi-port feedback circuit connected to an input terminal and an output terminal of said power transistor, said multi-port feedback circuit receiving said amplified high-frequency signal and eliminating the reverse admittance of said amplified high-frequency signal to let the admittance value of the output amplified high-frequency signal approach zero;
a signal output terminal for outputting said amplified high-frequency signal processed by said multi-port feedback circuit; and
two impedance matching circuits respectively disposed at said signal input terminal and said signal output terminal and used to perform impedance matching to high-frequency signals from said signal input terminal to said signal output terminal.

2. The unilateral feedback power amplifier as claimed in claim 1, wherein said multi-port feedback circuit is a 4-port feedback circuit.

3. The unilateral feedback power amplifier as claimed in claim 2, wherein said unilateral feedback power amplifier utilizes a matrix:

$$Y_L = \frac{\begin{pmatrix} -Y_{24}^f Y_{33}^f Y_{41}^f Y_{21}^d + Y_{23}^f Y_{34}^f Y_{41}^f Y_{21}^d + \\ Y_{24}^f Y_{31}^f Y_{43}^f Y_{21}^d - Y_{21}^f Y_{34}^f Y_{43}^f Y_{21}^d - Y_{23}^f Y_{31}^f Y_{44}^f Y_{21}^d + \\ Y_{21}^f Y_{33}^f Y_{44}^f Y_{21}^d + Y_{34}^f Y_{41}^f Y_{12}^d Y_{21}^d - Y_{31}^f Y_{44}^f Y_{12}^d Y_{21}^d + \\ Y_{24}^f Y_{32}^f Y_{41}^f Y_{22}^d - Y_{22}^f Y_{34}^f Y_{41}^f Y_{22}^d - Y_{24}^f Y_{31}^f Y_{42}^f Y_{22}^d + \\ Y_{21}^f Y_{34}^f Y_{42}^f Y_{22}^d + Y_{22}^f Y_{31}^f Y_{44}^f Y_{22}^d - Y_{21}^f Y_{32}^f Y_{44}^f Y_{22}^d - \\ Y_{34}^f Y_{41}^f Y_{11}^d Y_{22}^d - Y_{21}^f Y_{44}^f Y_{11}^d Y_{22}^d + Y_{31}^f Y_{44}^f Y_{11}^d Y_{22}^d + \\ Y_{24}^f Y_{32}^f Y_{41}^f Y_{opt} - Y_{24}^f Y_{32}^f Y_{42}^f Y_{opt} + Y_{21}^f Y_{34}^f Y_{42}^f Y_{opt} + \\ Y_{22}^f Y_{31}^f Y_{44}^f Y_{opt} - Y_{34}^f Y_{41}^f Y_{11}^d Y_{opt} + Y_{31}^f Y_{44}^f Y_{11}^d Y_{opt} + \\ Y_{24}^f Y_{32}^f Y_{21}^d Y_{opt} - Y_{21}^f Y_{44}^f Y_{21}^d Y_{opt} \end{pmatrix}}{\begin{pmatrix} Y_{23}^f Y_{31}^f Y_{21}^d - Y_{21}^f Y_{33}^f Y_{21}^d + Y_{31}^f Y_{12}^d Y_{21}^d - Y_{22}^f Y_{31}^f Y_{22}^d + \\ Y_{21}^f Y_{32}^f Y_{22}^d - Y_{31}^f Y_{11}^d Y_{22}^d - Y_{22}^f Y_{31}^f Y_{opt} + Y_{21}^f Y_{32}^f Y_{opt} - \\ Y_{31}^f Y_{11}^d Y_{opt} + Y_{21}^f Y_{21}^d Y_{opt} \end{pmatrix}}$$

to match the admittance value, where $Y_{mn}^f$, (m,n∈N, $1 \leq m, n \leq 4$) are 4-port admittance matrix parameters of said 4-port feedback circuit, $Y_{21}^d$ (m,n∈N, $1 \leq m, n \leq 2$) are 2-port admittance matrix parameters of said power transistor, $Y_L$ is a load admittance at the maximum output power, and $Y_{opt}$ is the admittance at the output terminal of said power transistor.

4. The unilateral feedback power amplifier as claimed in claim 3, wherein said 4-port feedback circuit makes said power transistor plus said feedback circuit unilateral by adjusting said 4-port admittance matrix parameters ($Y_{mn}^f$).

5. The unilateral feedback power amplifier as claimed in claim 3, wherein said 4-port feedback circuit achieves conjugate matching with the output impedance of said power transistor plus said feedback circuit by adjusting said admittance value ($Y_{opt}$) at the output terminal of said power transistor.

6. The unilateral feedback power amplifier as claimed in claim 1, wherein a ground terminal of said power transistor is directly connected to a system ground.

7. The unilateral feedback power amplifier as claimed in claim 1, wherein said multi-port feedback circuit is capable of making a high-frequency signal amplified by said power transistor unilateral.

8. The unilateral feedback power amplifier as claimed in claim 2, wherein said 4-port feedback circuit further comprises:
two 2-port circuits respectively disposed at an input terminal and an output terminal of said power transistor; and
a capacitive shunt component to let said 2-port circuit at said input terminal of said power transistor and said 2-port circuit at said output terminal of said power transistor be shunted together.

9. The unilateral feedback power amplifier as claimed in claim 8, wherein said capacitive shunt component is used to eliminate the imaginary part of the reverse admittance of said high frequency signal amplified by said power transistor.

10. The unilateral feedback power amplifier as claimed in claim 8, wherein said 2-port circuits are used to eliminate the real part of the reverse admittance of said high frequency signal amplified by said power transistor.

* * * * *